United States Patent [19]

Guazzoni et al.

[11] 4,218,266
[45] Aug. 19, 1980

[54] LIQUID HYDROCARBON-FUELED THERMO-ELECTRIC GENERATOR WITH COUNTER-FLOW TYPE REGENERATIVE HEAT EXCHANGER

[75] Inventors: Guido Guazzoni, Wayside; Andrew Herchakowski, Fair Haven, both of N.J.

[73] Assignee: The United States of America as represented by the Secretary of the Army, Washington, D.C.

[21] Appl. No.: 971,766

[22] Filed: Dec. 21, 1978

[51] Int. Cl.² ............................................. H01L 35/28
[52] U.S. Cl. ....................................... 136/209; 60/320; 136/205; 136/212; 261/149
[58] Field of Search .................. 136/205, 209, 212; 60/320; 165/52; 261/149

[56] References Cited

U.S. PATENT DOCUMENTS

| | | | |
|---|---|---|---|
| 3,006,979 | 10/1961 | Rich | 136/212 X |
| 3,496,919 | 2/1970 | Gerrard | 261/145 |
| 3,881,962 | 5/1975 | Rubinstein | 136/209 |
| 3,955,546 | 5/1976 | Lee, Jr. | 261/145 |
| 4,039,352 | 8/1977 | Marinescu | 136/205 |

FOREIGN PATENT DOCUMENTS

| | | | |
|---|---|---|---|
| 1174864 | 7/1964 | Fed. Rep. of Germany | 136/205 |
| 876474 | 9/1961 | United Kingdom | 136/209 |

Primary Examiner—Leland A. Sebastian
Attorney, Agent, or Firm—Nathan Edelberg; Jeremiah G. Murray; Bernard Franz

[57] ABSTRACT

An air-to-air heat exchanger, comprising an array of stainless steel tubings arranged in a three-fold pass, is connected to the outlet of the combustion chamber of a liquid hydrocarbon-fueled, thermoelectric generator. Air enters the heat exchanger at the ambient temperature and is pre-heated up to 500° C. At the same time, the temperature of the gases leaving the combustion chamber is reduced from 700° C. to only 200° C. This pre-heating of the air reduces fuel consumption, increases efficiency and makes it more difficult to detect the generator by means of its infrared signature.

5 Claims, 3 Drawing Figures

LIQUID HYDROCARBON-FUELED THERMO-ELECTRIC GENERATOR WITH COUNTER-FLOW TYPE REGENERATIVE HEAT EXCHANGER

GOVERNMENT LICENSE

The invention described herein may be manufactured and used by or for the Government for governmental purposes without the payment of any royalties thereon or therefor.

BACKGROUND OF THE INVENTION (a) Field of the Invention

Broadly speaking, this invention relates to thermoelectric generators. More particularly, in a preferred embodiment, this invention relates to a thermoelectric generator having a counter-flow type regenerative heat-exchanger.

(b) Discussion of the Prior Art

As is well known, thermoelectric power generators convert heat which is obtained from the combustion of hydrocarbon fuel, directly into electrical energy. Such devices are widely used for commercial applications and are now under development by the military because they provide low maintenance, high reliability, and silent operation and can also be used with a variety of fuels.

Unfortunately, prior art generators are relatively inefficient and have high exhaust temperatures, which is particularly disadvantageous from a military standpoint, because it makes the generators relatively easy to detect via their infrared signature.

SUMMARY OF THE INVENTION

It is, accordingly, an object of this invention to provide a thermoelectric generator that operates with higher efficiency and lower exhaust temperatures than that heretofore available.

The above and other objects are achieved by connecting a heat exchanger to the exhaust of the generator to pre-heat the air which is supplied to the combustion chamber. In a preferred embodiment, the heat exchanger comprises a plurality of stainless steel tubes arranged in a three-fold pass. This structure minimizes the size of the exchanger, while at the same time does not introduce excessive impedance into the flow of air to the combustion chamber.

The invention, and its mode of operation, will be more fully understood from the following detailed description, when taken with the appended drawings, in which:

DETAILED DESCRIPTION OF THE INVENTION

Figure 1:
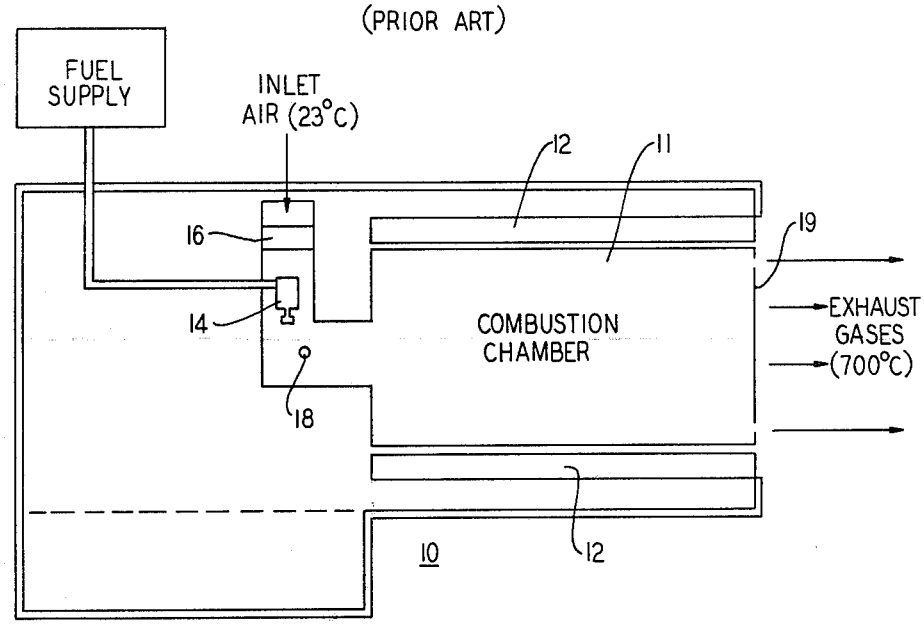
FIG. 1 is a block schematic diagram of a typical prior art thermoelectric generator.

FIG. 1 depicts a typical prior art thermoelectric generator, for example, a 500 Watt generator fueled by a liquid hydrocarbon such as JP-4 aviation fuel. As shown, generator 10 comprises a combustion chamber 11 which communicates with a thermoelectric converter 12. Fuel from a fuel supply 13 is atomized by an automizer 14 and mixed with air at the ambient temperature. The air is supplied by a blower 16 which connects to an air intake 17. The fuel/air mixture is ignited at 18 and combustion takes place in the combustion chamber, the exhaust gases being discharged through the exhaust 19.

In a typical prior art generator, only 55% of the heat generated in the combustion chamber is passed to the thermoelectric converter, the remaining 45% being carried out by the exhaust gases at temperatures as high as 700° C. As a result of this, the overall efficiency of the power source is only about 3%.

Figure 2:
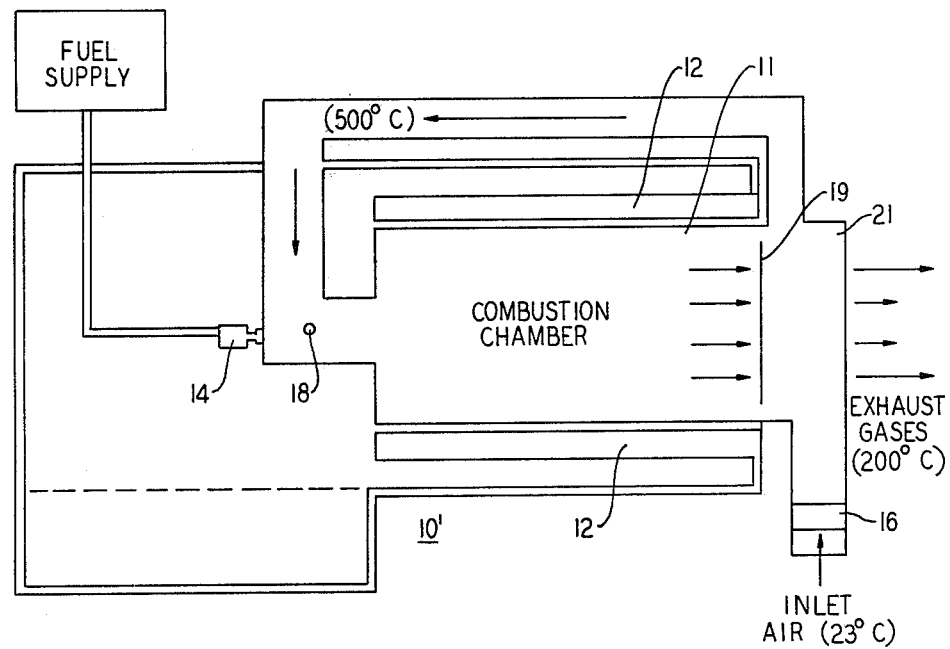
FIG. 2 is a block schematic diagram of a thermoelectric generator according to the invention including a counter-flow type regenerative heat exchanger.

FIG. 2 depicts a thermoelectric generator according to the invention. As shown, generator 10 differs from prior art generator 10 in that a heat-exchanger 21 is connected to the exhaust 19 of the combustion chamber 11. In this embodiment of the invention, blower 16 is moved to the inlet side of heat exchanger 21 and fuel atomizer 14 is moved out of the air flow, but otherwise the thermoelectric generator of FIG. 2 is identical to that of FIG. 1. This has the advantage that existing thermoelectric generators can readily be upgraded by retrofitting them with a heat-exchanger according to the teachings of this invention.

In operation, primary air for combustion is taken in by blower 16 and passed through the air-to-air heat exchanger 21 where it extracts heat from the exhaust gases and is warmed to about 500° C. The pre-heated air is mixed with atomized fuel and ignited at 18 where it burns in the combustion chamber, as before. However, the exhaust gases, which are still at 700° C., are cooled to 200° C. as they leave the generator by virtue of the heat exchanged with the incoming air at ambient (23° C.) temperature.

Because the incoming air is pre-heated, less fuel is needed to achieve the operating combustion chamber temperature. Thus, the overall efficiency of the unit, defined as the ratio of the thermoelectric converter output to the heat content of the fuel burned, is significantly increased.

To evaluate the saving in fuel and the corresponding improvement of the overall efficiency obtained with the use of the regenerative burner system, a 500 Watt thermoelectric power source was operated in comparative tests, first in the prior art configuration and then as equipped with the regenerative burner system described with reference to FIG. 2. The comparative tests, which were performed under the same environmental conditions, utilizing the same fuel, indicated a fuel saving of 26–27% and a corresponding overall efficiency increase of approximately 37%, that is, an increase of efficiency from 2.9–3.0% to 4.0–4.2%.

At the end of the test run with the regenerative burner system, an inspection of the combustion chamber and burner tube section revealed relatively clean and carbonless walls and components, indicative of a more complete combustion which will alleviate the carbon build-up problem experienced when operating prior art thermolectric power sources with heavy hydrocarbon fuels in low environmental ambient temperatures.

Figure 3:
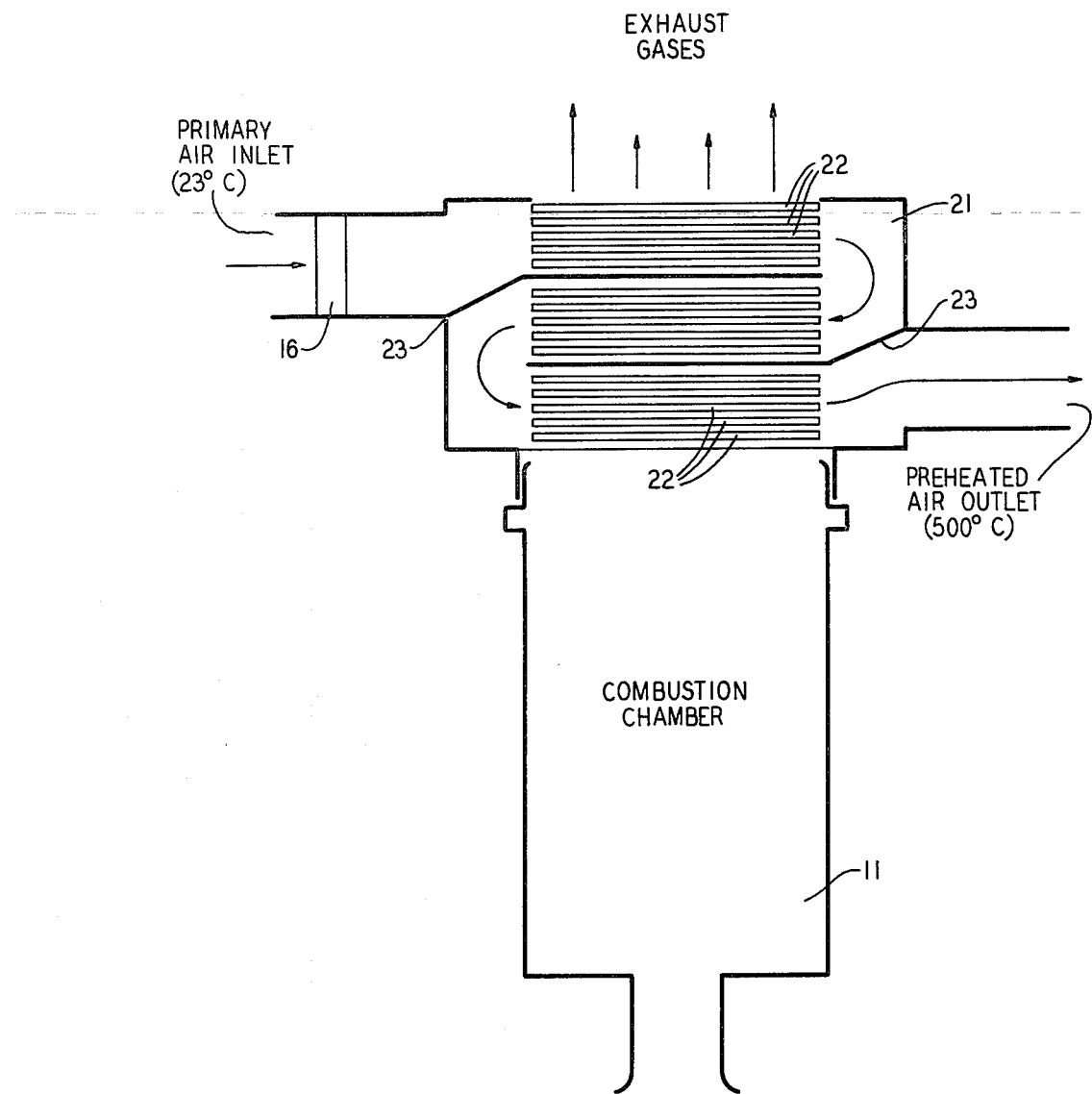
FIG. 3 is a schematic, partially cross-sectional view of the heat exchanger shown in FIG. 2.

As shown in FIG. 3, a preferred arrangement for heat exchanger 21 comprises a plurality of stainless steel tubes 22 through which the primary air passes on its way to the point of mixture with the atomized fuel. The outer walls of the stainless steel tubes are in the path of the exhaust gases and, thus, exchange the heat from the exhaust gases with the incoming air at the ambient temperature, raising the same from about 23° C. up to 500° C. As shown, a pair of baffles 23 configure the tubes 22 into a three-pass system although, obviously, other configurations are possible.

The following are the results of some actual experiments:

COMPARATIVE TESTS WITH AND WITHOUT REGENERATIVE BURNER SYSTEM
FUEL USED JP-4 (18,400 BTU/lb)
(A) TEST WITH A 500 WATT T.E. POWER SOURCE IN THE PRIOR ART CONFIGURATION (WITHOUT REGENERATIVE BURNER)

| THERMOPILE OUTPUT | Volts = 25.0 | FUEL | 200ml in 6m 2 sec |
|---|---|---|---|
| (T.E. Power) | Amps = 20.7 | CONSUMPTION | |
| (Source Output) | Watts = 517 | | 300ml in 9m 7 sec |
| FUEL PUMP | Volts = 11.03 | PRIMARY AIR BLOWER | Volts = 14.94 |
| POWER | Amps = 0.07 | INVERTER POWER | Amps = 2.1 |
| REQUIREMENT | Watts = 0.8 | REQUIREMENT | Watts = 31.4 |

A fuel consumption of 300 ml (of JP-4-Density 0.76) in 9 minutes and 7 seconds, corresponds to the following Fuel Flow Rate Per Hour:

$$\frac{300 ml}{547 sec} \times \frac{3600 sec}{1 hr} \times \frac{0.76 grams}{1 ml} \times \frac{1 lb}{453 grams} = 3.3 \, lb/hr$$

The corresponding thermopile efficiency is therefore:

$$E = \frac{517 \, Watt/Hr \, (output)}{3.3 \, lb/hr \times 18,400 \, BTU/lb} \times 3.41 \, BTU/W = 2.91\%$$

(B) TEST WITH A 500 WATT T.E. POWER SOURCE EQUIPPED WITH THE REGENERATIVE BURNER SYSTEM

| THERMOPILE OUTPUT | Volts = 25.02 | FUEL CONSUMPTION | 200ml in 8m 11sec |
|---|---|---|---|
| (T.E. Power Source | Amps = 21 | | |
| Output) | Watts = 525 | | 300ml in 12m 18sec |
| FUEL PUMP | Volts = 8.55 | PRIMARY AIR BLOWER | Volts = 12.68 |
| POWER | Amps = 0.07 | INVERTER POWER | Amps = 1.75 |
| REQUIREMENT | Watts = 0.6 | REQUIREMENT | Watts = 22.19 |

A fuel consumption of 300 ml (of JP-4-Density 0.76) in 12 minutes and 18 seconds, corresponds to the following Fuel Flow Rate Per Hour:

$$\frac{300 ml}{738 sec} \times \frac{3600 sec}{1 hr} \times \frac{0.76 grams}{1 ml} \times \frac{1 lb}{453 grams} = 2.45 \, lb/hr$$

The Fuel Saving Results in $\frac{3.3 - 2.45}{3.3} = 25.8\%$ (Comparison with Test A)

The corresponding thermopile efficiency is now increased to:

$$E = \frac{525 \, Watt/Hr}{2.45 \, lb/hr \times 18,400 \, BTU/lb} \times 3.41 \, BTU/Watt = 3.98\%$$

The increase in unit efficiency is therefore:

$$\frac{3.98 - 2.91}{2.91} = 36.8\%$$

In addition to the Fuel Saving (25.8%) and the increase in efficiency (36.8%), the comparative tests show, in the case of the unit equipped with the regenerative burner system, a saving on the power requirements for the primary air blower inverter (from 31.4 W down to 21.19 W) and for the fuel pump.

An additional series of comparative tests was run with the following results:

ADDITIONAL COMPARATIVE TESTS WITH AND WITHOUT REGENERATIVE BURNER SYSTEM
FUEL USED JP-4 (18,400 BTU/lb)
(C) TEST WITH THE 500 WATT T.E. POWER SOURCE IN THE PRIOR ART CONFIGURATION (WITHOUT THE REGENERATIVE BURNER SYSTEM)

| THERMOPILE OUTPUT | Volts = 25.0 | FUEL | 200ml in 6m 0 sec |
|---|---|---|---|
| (T.E. Power Source | Amps = 22.0 | CONSUMPTION | |
| Output) | Watts = 550 | | 300ml in 9m 2 sec |
| | | | 400ml in 12m 6 sec |
| | | | 500ml in 15m 10 sec |
| FUEL PUMP | Volts = 11.12 | PRIMARY AIR BLOWER | Volts = 14.32 |
| POWER | Amps = 0.07 | INVERTER POWER | Amps = 2.0 |
| REQUIREMENT | Watts = 0.8 | REQUIREMENT | Watts = 28.64 |

A fuel consumption of 500 ml in 15 minutes and 10 seconds (JP-4-Density 0.76) corresponds to the following Fuel Flow Rate in lb/hr:

$$\frac{500 ml}{910 sec} \times \frac{3600 sec}{1 hr} \times \frac{0.76 grams}{1 ml} \times \frac{1 lb}{453 grams} = 3.32 \, lb/hr$$

The corresponding thermopile efficiency is therefore:

$$E = \frac{550 \text{ Watts/Hr}}{3.32 \text{ lb/hr}} \times \frac{3.41 \text{ BTU/Watt}}{18,400 \text{ BTU/lb}} = 3.06\%$$

(D) TEST WITH A 500 WATT T.E. POWER SOURCE EQUIPPED WITH THE REGENERATIVE BURNER SYSTEM

| THERMOPILE OUTPUT (T.E. Power Source Output) | Volts = 25.0<br>Amps = 22.2<br>Watts = 555 | FUEL CONSUMPTION | 200ml in 8m 11sec<br>300ml in 12m 19sec<br>400ml in 16m 26sec<br>500ml in 20m 37sec |
|---|---|---|---|
| FUEL PUMP POWER REQUIREMENT | Volts = 8.72<br>Amps = 0.07<br>Watts = 0.6 | PRIMARY AIR BLOWER INVERTER POWER REQUIREMENT | Volts = 13.2<br>Amps = 1.85<br>Watts = 24.4 |

A fuel consumption of 500 ml in 20 minutes and 37 seconds (JP-4-Density 0.76) corresponds to the following Fuel Flow Rate in lb/hr:

$$\frac{500 \text{ml}}{1237 \text{ sec}} \times \frac{3600 \text{ sec}}{1 \text{ hr}} \times \frac{0.76 \text{ grams}}{1 \text{ ml}} \times \frac{1 \text{ lb}}{453 \text{ grams}} = 2.44 \text{ lb/hr}$$

The fuel saving (as compared to the Test A) results to be:

$$\frac{3.32 - 2.44}{3.32} = 26.8\%$$

The corresponding efficiency (for Test B) is now increased to:

$$\frac{555 \text{ Watt/Hr}}{2.44 \text{ lb/hr}} \times \frac{3.41 \text{ BTU/Watt}}{18,400 \text{ BTU/lb}} = 4.22\%$$

The increase in the T. P. efficiency (Power Source Efficiency) results therefore to be:

$$\frac{4.22 - 3.06}{3.06} = 38\%$$

One skilled in the art may make various changes and substitutions to the layout of parts shown without departing from the spirit and scope of the invention.

What we claim is:

1. A thermoelectric generator which comprises:
   a combustion chamber having an inlet end and an outlet end;
   a thermoelectric converter associated with the walls of said combustion chamber;
   a source of a liquid hydrocarbon fuel;
   means for atomizing said fuel;
   means for supplying air to mix with said atomized fuel to thereby form a combustible mixture;
   means for igniting said combustible mixture, said mixture burning in the combustion chamber to heat said thermoelectric converter, the exhaust gases resulting from said combustion passing out of said generator through the outlet end of said combustion chamber; and
   means, associated with the outlet end of said combustion chamber, for pre-heating the air supplied to mix with said atomized fuel thereby to increase the efficiency of said generator.

2. The apparatus according to claim 1 wherein said pre-heating means comprises an air-to-air heat exchanger for removing heat energy from the exhaust gases exiting said combustion chamber and supplying same to heat said air.

3. The apparatus according to claim 2 wherein said heat exchanger comprises a plurality of tubes through which said air passes, arranged so that the exhaust gases from said combustion chamber flow over the outer walls of said tubes thereby to heat the air passing through the tubes.

4. The apparatus according to claim 3 further including first and second baffles positioned such that the air traverses said heat exchanger three times, thus forming a three-fold pass.

5. The apparatus according to claim 4 wherein said tubes comprise stainless steel, whereby said heat exchanger provides means such that the temperature of the exhaust gases is reduced from approximately 700 degrees C. to approximately 200 degrees C., and the temperature of said air is increased from the ambient (27 degrees C.) to approximately 500 degrees C.

* * * * *